United States Patent
Rao et al.

(10) Patent No.: US 6,243,294 B1
(45) Date of Patent: Jun. 5, 2001

(54) MEMORY ARCHITECTURE FOR NON-VOLATILE STORAGE USING GATE BREAKDOWN STRUCTURE IN STANDARD SUB 0.35 MICRON PROCESS

(75) Inventors: Kameswara K. Rao, San Jose; Martin L. Voogel, Santa Clara; Michael J. Hart, Palo Alto, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/552,625

(22) Filed: Apr. 19, 2000

Related U.S. Application Data

(63) Continuation-in-part of application No. 09/262,981, filed on Mar. 5, 1999, now Pat. No. 6,055,205.

(51) Int. Cl.[7] .................................................. G11C 16/04

(52) U.S. Cl. ............................ 365/185.14; 365/185.26; 365/189.06

(58) Field of Search ............................ 365/192, 185.14, 365/185.12, 185.26, 189.08

(56) References Cited

U.S. PATENT DOCUMENTS

| | | | |
|---|---|---|---|
| 4,689,504 | 8/1987 | Raghunathan et al. | 307/449 |
| 5,541,529 | * 7/1996 | Mashiko et al. | 326/39 |
| 5,563,842 | 10/1996 | Challa | 365/230.06 |
| 5,604,693 | 2/1997 | Merrit et al. | 365/96 |
| 5,680,360 | 10/1997 | Pilling et al. | 365/225.7 |
| 5,790,448 | 8/1998 | Merritt et al. | 365/96 |
| 5,796,656 | 8/1998 | Kowshik et al. | 365/185.23 |
| 5,812,459 | 9/1998 | Atsumi et al. | 365/185.23 |
| 5,831,923 | 11/1998 | Casper | 365/225.7 |
| 5,986,916 | 11/1999 | Merritt et al. | 365/96 |

OTHER PUBLICATIONS

Ying Shi et al.; "Polarity Dependent Gate Tunneling Currents in Dual–Gate CMOSFET's", IEEE Transactions on Electron Devices, vol. 45, No. 11, Nov. 1998, pp. 2355–2360.

Philippe Candelier et al., "One Time Programmable Drift Anitfuse Cell Reliability", IEEE 38th Annual International Reliability Physics Symosium, San Jose, CA, 2000, pp. 169–173.

Joo–Sun Choi et al., "Antifuse EPROM Circuit for Field Programmable DRAM", IEEE International Solid–State Circuit Conference, 2000, Session 24, Paper WP 24.8, pp. 406–407 and 330–331.

* cited by examiner

Primary Examiner—David Nelms
Assistant Examiner—Thong Le
(74) Attorney, Agent, or Firm—Edel M. Young

(57) ABSTRACT

A field programmable gate array (FPGA) contains an array of memory cells. A word line is coupled to a row of memory cells in the array. A second signal line is coupled to the row of memory cells and extends in parallel with the word line. The second signal line applies a zero voltage to the memory cells when programming a memory cell in the row of memory cells. The second signal line applies a positive voltage to the memory cells when programming a memory cell outside the row of memory cells. Each memory cell is a one-time programmable non-volatile memory cell. Each memory cell includes a storage transistor and an access transistor coupled to one another. The memory cell can be programmed by selecting a word line and a bit line associated with the memory cell being programmed. A zero voltage is applied to a third signal line coupled to the memory cell and extending parallel to the word line. A programming voltage is applied to the selected bit line to program the memory cell.

23 Claims, 7 Drawing Sheets

MEMORY ARCHITECTURE FOR NON-VOLATILE STORAGE USING GATE BREAKDOWN STRUCTURE IN STANDARD SUB 0.35 MICRON PROCESS

PRIORITY PATENT

This application is a continuation-in-part of U.S. patent application Ser. No. 09/262,981, filed on Mar. 5, 1999, now U.S. Pat. No. 6,055,205 the disclosure of which is incorporated by reference herein.

CROSS REFERENCE TO RELATED APPLICATIONS

This application relates to

1. U.S. patent application Ser. No. 09/552,280 entitled "REDUNDANCY SCHEME TO IMPROVE PROGRAMMING YIELD FOR NON-VOLATILE MEMORY USING GATE BREAKDOWN STRUCTURE IN STANDARD SUB 0.25 MICRON CMOS PROCESS" commonly owned and filed concurrently with the present application.

2. U.S. patent application Ser. No. 09/552,571 entitled "NON-VOLATILE MEMORY ARRAY USING GATE BREAKDOWN STRUCTURES" commonly owned and filed concurrently with the present application.

3. U.S. patent application Ser. No. 09/524,971 entitled "INTELLECTUAL PROPERTY PROTECTION IN A PROGRAMMABLE LOGIC DEVICE" commonly owned and filed Mar. 4, 200.

These related applications are incorporated herein by reference.

TECHNICAL FIELD

This invention relates to integrated circuits, particularly programmable logic devices or field programmable gate arrays (FPGAs). More particularly, this invention relates to memory architectures for use in non-volatile memory arrays that are incorporated into FPGAs.

BACKGROUND OF THE INVENTION

Many integrated circuits now in use are fabricated in what is called CMOS (complimentary metal oxide semiconductor) technology, which forms both PMOS and NMOS transistors on a silicon substrate. One of the main objectives of integrated circuit technology is to minimize transistor size. Transistors are typically described in terms of their minimum feature dimension.

Current technology provides a minimum feature size of 0.35 micron or less. The minimum feature size, which is also referred to as a "line width", refers to the minimum width of a transistor feature such as the gate width, or the separation between source and drain diffusion regions. Typically, 0.35 micron technology is used to form CMOS transistors having a gate oxide thickness of 70 Å (angstroms). A 0.18 micron technology is used to form CMOS transistors having a gate oxide thickness of around 35–40 Å. A 0.15 micron technology is used to form CMOS transistors having a gate oxide thickness of around 25–30 Å. The gate "oxide", is typically an oxide dielectric layer that is interposed between the conducting gate electrode, which is typically a polycrystalline silicon structure formed overlying the principal surface of a substrate in which the integrated circuit if formed, and the underlying substrate which typically is the channel portion of the transistor extending between the source and the drain regions. Transistors formed using the 0.35 micron technology typically operate at a voltage of 3.3 volts. Transistors formed using the 0.18 micron technology typically operate at a voltage of 1.8 volts. Greater voltages are likely to destroy the transistor by rupturing the gate oxide. Sub 0.35 micron processes provide for two different transistor families having different gate oxide thicknesses. A first transistor family has a thin gate oxide and a second transistor family has a thick gate oxide.

In the field of data storage, there are two main types of storage elements. The first type of storage element is a volatile storage element such as typically used in DRAM (dynamic random access memory) or SRAM (static random access memory) in which the information stored in a particular storage element is lost when power is removed from the circuit.

The second type of storage element is a non-volatile storage element in which the information stored in the storage element is preserved even if power is removed from the circuit. Typically, the types of elements used to provide non-volatile storage are substantially different from those used in ordinary logic circuitry or in volatile storage, thereby requiring different fabrication techniques.

It has heretofore not been possible to include non-volatile storage on an integrated circuit chip formed exclusively using standard CMOS processes.

SUMMARY OF THE INVENTION

Memory architectures for use in non-volatile memory arrays and methods of programming memory cells are described. In the described embodiments, the cell structure can be fabricated using standard CMOS processes, e.g., sub 0.35 micron or sub 0.25 micron processes. Alternatively, the cell structures can be fabricated using 0.18 micron or 0.15 micron standard CMOS process. Particular embodiments may be implemented in a FPGA.

In particular embodiments, the cell structures are fabricated using a standard 0.18 micron CMOS process. In these embodiments, memory cells are fabricated using storage structures, including transistors, having different gate breakdown characteristics (e.g., as impacted by the thickness of their gate dielectric layers). The memory cells are programmed by taking advantage of the different gate breakdown characteristics.

In one embodiment, a FPGA includes an array of memory cells and a word line coupled to a row of memory cells in the array. A second signal line is coupled to the row of memory cells and extends in parallel with the word line. The second signal line applies a zero voltage to the memory cells when programming a memory cell in the row of memory cells. A positive voltage is applied to the second signal line when programming a memory cell outside the row of memory cells.

According to another implementation, each memory cell includes a storage transistor and an access transistor coupled to the storage transistor.

In another embodiment, each memory cell is programmed by breaking the gate oxide of a storage transistor in the memory cell.

In a further embodiment, a memory cell is programmed by selecting a word line and a bit line associated with the memory cell being programmed. A zero voltage is applied to a third control signal line coupled to the memory cell and extending in parallel with the word line. A programming voltage is applied to the selected bit line to program the memory cell.

DETAILED DESCRIPTION OF THE DRAWINGS

The disclosure of an Application entitled "Non-Volatile Memory Array Using Gate Breakdown Structures", and bearing client docket number X-632, is incorporated by reference herein. That application was filed on the same date as this application and is assigned to the assignee of this application.

The embodiments described below relate to a memory system that contains multiple memory cells arranged in a two-dimensional array. The memory system has an architecture that protects access transistors contained in memory cells from damage when programming a particular memory cell in the array.

Figure 1:
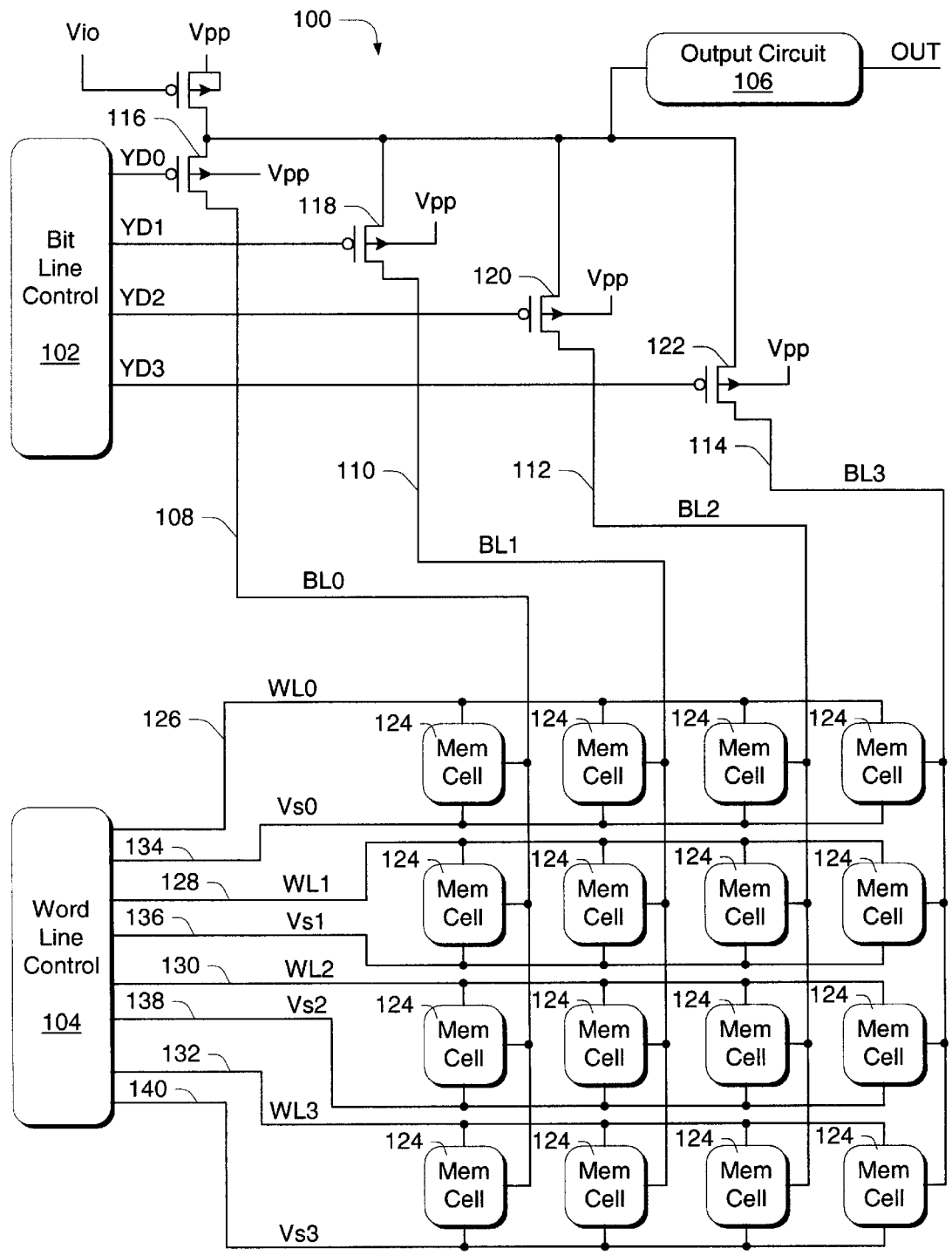
FIG. 1 is a schematic diagram illustrating an exemplary memory system including an array of memory cells.

FIG. 1 is a schematic diagram illustrating an exemplary memory system 100 including an array of memory cells. Particular embodiments of memory system 100 are fabricated on an integrated circuit chip in accordance with a 0.18 micron CMOS (complimentary metal oxide semiconductor) process. However, the teachings of the present invention can be applied to other processing techniques.

Memory system 100 includes a bit line control 102, a word line control 104, and an output circuit 106, all of which are described in greater detail below. Bit line control 102 selects one of four bit lines 108, 110, 112, or 114, labeled BL0, BL1, BL2, and BL3, respectively. Each bit line 108–114 is coupled to a column of four memory cells 124. A particular bit line is selected by activating one of four p-channel devices 116, 118, 120, or 122. For example, bit line control 102 activates the bit line 112 (BL2) by activating p-channel device 120 using control signal YD2. Typically, no more than one bit line 108–114 is selected at a particular time.

Word line control 104 selects one of four word lines 126, 128, 130, or 132, labeled WL0, WL1, WL2, and WL3, respectively. Each word line 126–132 is coupled to a row of four memory cells 124. A particular row of memory cells is selected by activating the corresponding word line. Typically, no more than one word line 126–132 is selected at a particular time. Selecting one bit line 108–114 and selecting one word line 126–132 identifies a particular memory cell 124 in the array. The identified memory cell 124 may be selected to be programmed with a bit of data or selected to read the data stored in the memory cell.

Each memory cell 124 is also coupled to one of four voltage source lines 134, 136, 138, or 140, labeled Vs0, Vs1, Vs2, and Vs3, respectively. As discussed in greater detail below, the voltage source lines 134–140 are used to protect the access transistors (discussed below) in memory cells 124 from damage when programming other memory cells in the array. Each memory cell 124 provides for the non-volatile storage of a single bit of data. Further, each memory cell 124 is one-time programmable, as discussed below. Although a 4×4 array of memory cells 124 is shown in FIG. 1, the invention may be applied to a memory array having any number of memory cells arranged in various configurations.

Table 1 below illustrates the various values and states of different signals based on the current mode of operation. For example, when program mode is selected, the PGM (Program) signal is activated to 3.3 volts, the selected word line is set to approximately 4 volts, and the selected YD signal is set to approximately 4 volts. Finally, Vpp is applied to the selected bit line to program the selected memory cell. Vpp is the programming voltage for the memory cell, which is approximately 8 volts.

TABLE 1

| Signal | Program Mode (Selected Line) | Program Mode (Deselected Lines) | Read Mode (Selected Line) | Read Mode (Deselected Lines) |
|---|---|---|---|---|
| PGM | 3.3 V | 3.3 V | 0 V | 0 V |
| WL | Appx. 4 V | Vpp | 0 V | 3.3 V |
| YD | Appx. 4 V | Vpp | 0 V | 3.3 V |
| BL | Vpp | Float | output circuit | float |

During the read mode, the selected word line (WL) is low and the selected YD line is low, which connects the selected bit line to the input of the output circuit 106. If there is no current in this condition, then the selected memory cell has not been programmed. If the memory cell has been programmed, then the memory cell allows current to flow. The current flows through the selected bit line, pulling down the value of the input to the output circuit 106.

Figure 2A:
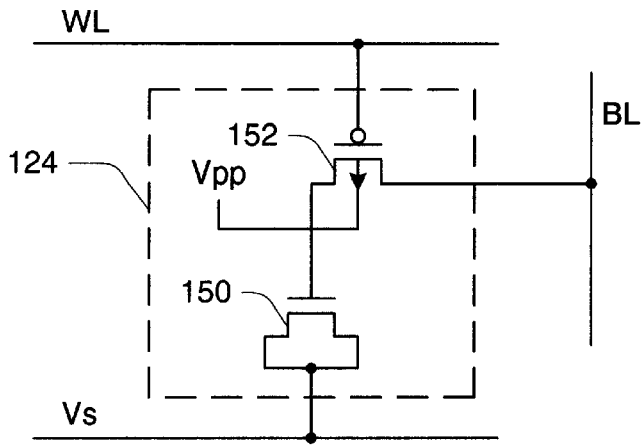
FIGS. 2A and 2B are schematic diagrams illustrating the structure of exemplary memory cells in accordance with the invention.

FIG. 2A is a schematic diagram illustrating the structure of an exemplary memory cell 124 in accordance with the invention. A gate breakdown transistor 150 has its source and drain connected to a voltage source line (Vs). The gate of breakdown transistor 150 is coupled to the source of an access transistor 152. The drain of access transistor 152 is coupled to an associated bit line (BL) and the gate of access transistor 152 is coupled to an associated word line (WL).

The non-volatile memory cell 124 is created using a standard CMOS process and uses the gate breakdown transistor 150 as the storage device. In 0.35 micron and sub-0.35 micron CMOS processes, the gate oxide thickness of the gate breakdown transistor 150 is 70 Å (angstroms) or less. In these processes, the resulting gate breakdown voltage of the transistor is less than the source-to-substrate and the drain-to-substrate breakdown voltage. The gate breakdown transistor 150 is "programmed" by breaking (or rupturing) the gate oxide of the gate breakdown transistor. Once the gate oxide of the transistor has been broken, the gate oxide cannot be "unbroken." Thus, the gate breakdown transistor 150 is one-time programmable. The gate breakdown transistor 150 may also be referred to as a gate breakdown device or a storage transistor. Additional details regarding the gate breakdown transistor are found in U.S. patent application Ser. No. 09/262,981, filed on Mar. 5, 1999, which is incorporated above by reference.

The access transistor 152 is, for example, a thick oxide p-channel device. The gate oxide thickness of the access transistor 152 is approximately 70 Å, which is greater than the thickness of a typical transistor of 40 Å. This added thickness prevents the access transistor 152 from breaking (or rupturing) when the associated gate breakdown transistor 150 is programmed.

The memory cell 124 is programmed by applying approximately 3.3 volts to the word line and approximately 8 volts to the bit line. Vs is set to zero volts. In this configuration, 8 volts is applied to the gate of the gate breakdown transistor 150, which breaks the gate oxide, thereby programming the memory cell 124.

During a read operation, if there is no current flow through the gate breakdown device 150, then the gate oxide of the device has not been broken. However, if the gate oxide of the gate breakdown device 150 has been broken, then the gate breakdown device functions similar to a resistor having a value less than 10,000 ohms.

In other configurations of the memory cell shown in FIG. 2A, both the source and the drain of gate breakdown transistor 150 are coupled to ground. This configuration may cause a certain amount of current leakage to ground for programmed devices in the selected column, thereby causing the circuit to draw a DC current. The configuration shown in FIG. 2A eliminates this leakage current by coupling the source and ground of the gate breakdown device to Vs instead of ground.

Figure 2B:
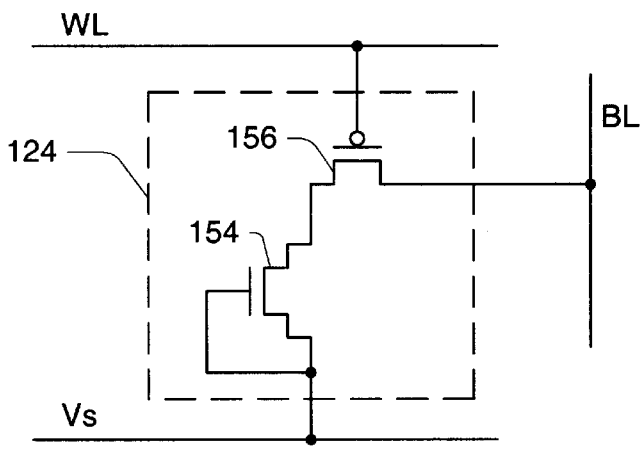

FIG. 2B is a schematic diagram illustrating another embodiment of the memory cell 124 in accordance with the invention. A gate breakdown transistor 154 has its source coupled to an access transistor 156 and its gate and drain coupled to the voltage source line (Vs). The drain of access transistor 156 is coupled to an associated bit line (BL) and the gate of access transistor 156 is coupled to an associated word line (WL). The gate breakdown transistor 154 is "programmed" by breaking (or rupturing) the gate oxide of the gate breakdown transistor.

The access transistor 156 is, for example, a thick oxide p-channel device. The gate oxide thickness of the access transistor 156 is approximately 70 Å, which is greater than the thickness of a typical transistor of 40 Å. This added thickness prevents the access transistor 156 from breaking (or rupturing) when the associated gate breakdown transistor 154 is programmed.

The memory cell 124 is programmed by applying approximately 3.3 volts to the word line and approximately 8 volts to the bit line. Vs is set to zero volts. In this configuration, 8 volts is applied to the gate breakdown transistor 154, which breaks the gate oxide, thereby programming the memory cell 124.

During a read operation, if there is no current flow through the gate breakdown device 154, then the gate oxide of the device has not been broken. However, if the gate oxide of the gate breakdown device 154 has been broken, then the gate breakdown device functions similar to a resistor having a value less than 10,000 ohms.

Figure 3:
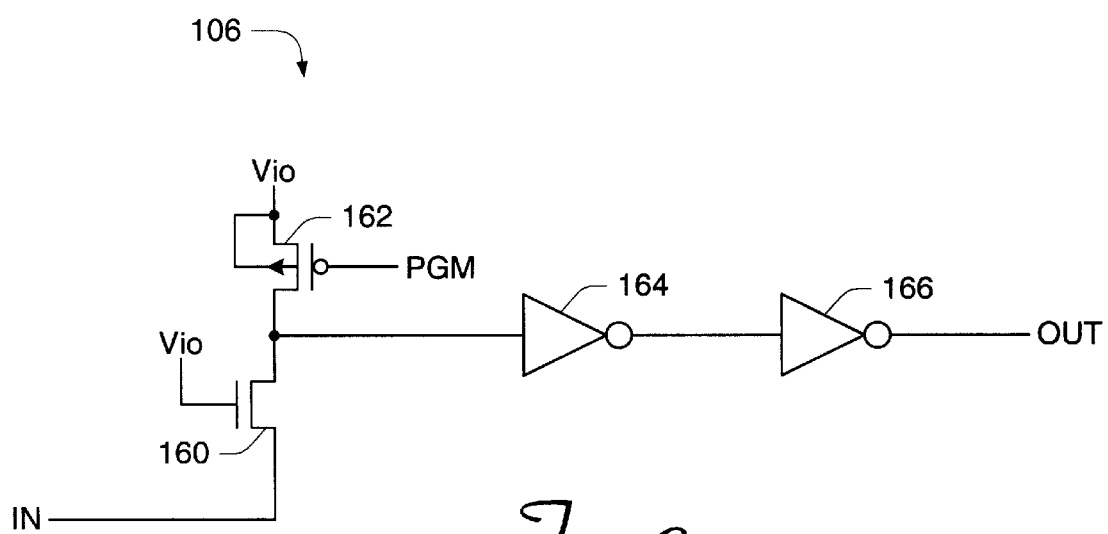
FIG. 3 is a schematic diagram illustrating an exemplary output circuit.

FIG. 3 is a schematic diagram illustrating an exemplary output circuit 106. The PGM signal coupled to the gate of p-channel device 162 determines whether the memory system 100 is in a read mode or a program mode. In read mode, the output circuit 106 is activated such that the data is read from the selected memory cell via the line labeled "IN", which is coupled to an N-channel device 160. The N-channel device 160 is also coupled to the p-channel device 162 and a pair of inverters 164 and 166, which generate an output signal (OUT). When the PGM signal is activated (i.e., indicating that the memory system 100 is in the program mode), the output circuit 106 is deactivated.

Figure 4:
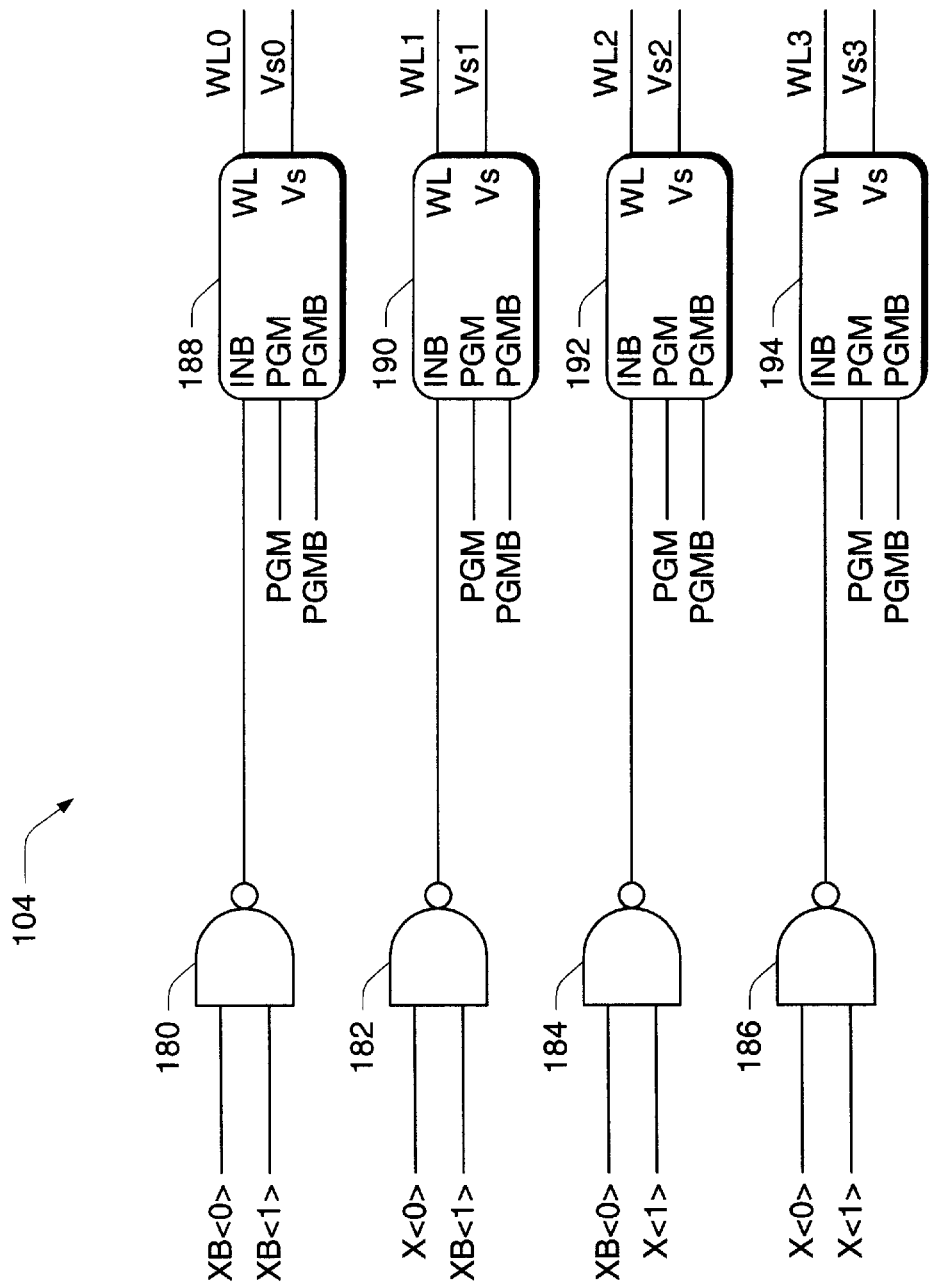
FIG. 4 is a schematic diagram illustrating an exemplary word line control circuit.

FIG. 4 is a schematic diagram illustrating an exemplary word line control circuit 104. Four NAND gates 180, 182, 184, and 186 receive various combinations of bits from a two-bit control signal X. Control signal X selects one of the four word lines (WL0–WL3). The notation XB<0> identifies the inverted value of bit 0 of control signal X and the notation X<1> identifies the value of bit 1 of control signal X. The output of each NAND gate 180–186 is coupled to a corresponding row decoder 188–194. Based on the value of the control signal X, one of the four NAND gates 180–186 will generate a logic "0", which activates the corresponding row decoder 188–194. Each row decoder 188–194 receives the PGM signal, which indicates whether the memory system 100 is in read mode or program mode. Further, each row decoder is associated with a particular word line (WL0, WL1, WL2, or WL3). When a particular row decoder is activated by the corresponding NAND gate, the word line associated with the row decoder is activated to select a particular row of memory cells 124.

If the memory system 100 is operating in the program mode, then all non-selected row decoders 188–194 activate Vs by applying approximately 3.3 volts to the Vs line. This activation of Vs protects access transistors in the previously programmed memory cells 124 from being damaged by the current programming operation. Specifically, by setting Vs at 3.3 volts, the voltage across the gate oxide of the p-channel device (e.g., device 152 in FIG. 2A) is reduced to 4.7 volts (8 volts–3.3 volts). If Vs was set to zero volts and the gate breakdown device was already programmed, then 8 volts (the programming voltage) would be applied across the gate oxide of the p-channel device, which would likely damage the device. When the programming operation is completed, the programming voltage is deactivated and Vs is returned to 0 volts.

Figure 5:
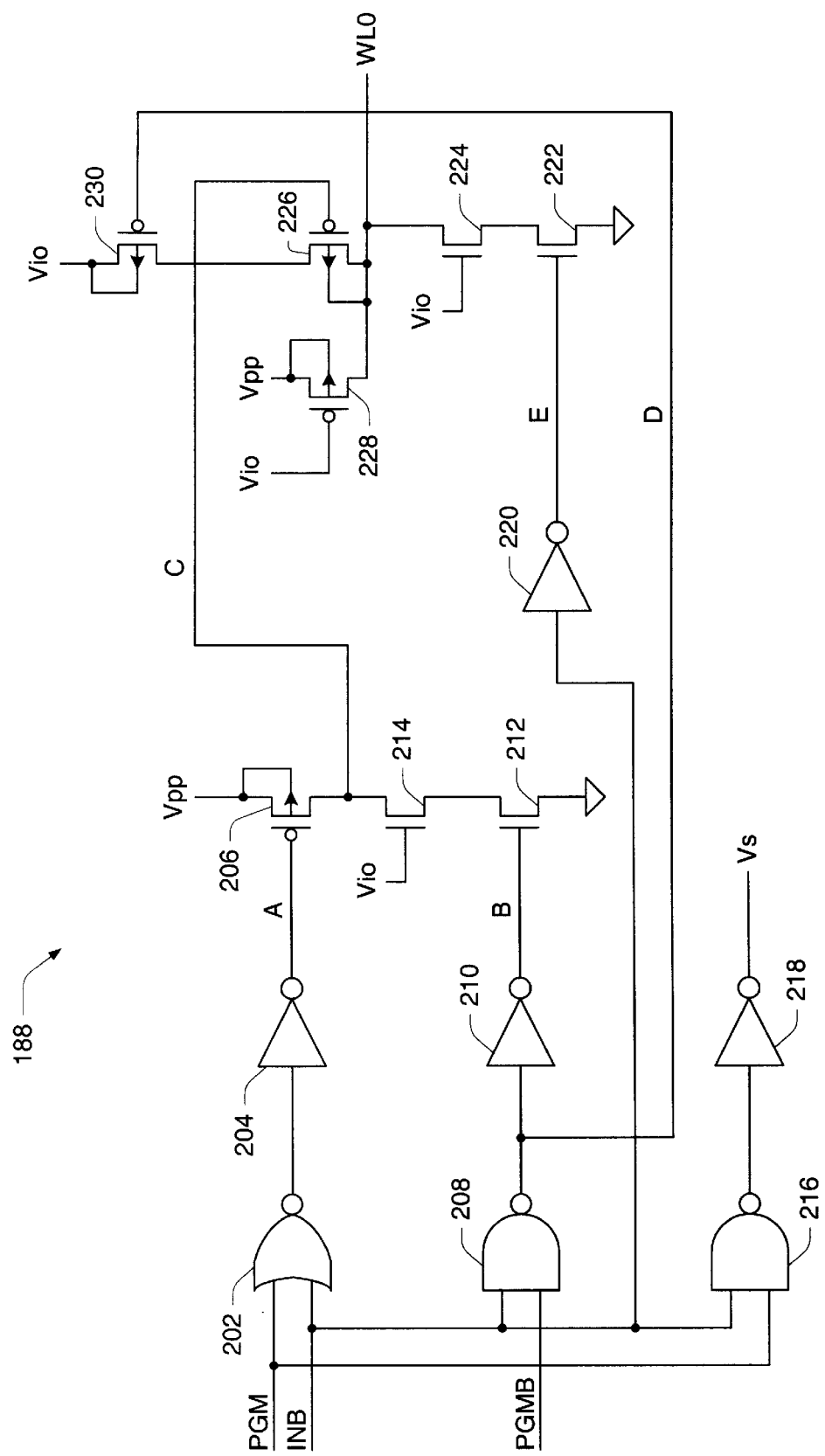
FIG. 5 is a schematic diagram illustrating an exemplary row decoder shown in FIG. 4.

FIG. 5 is a schematic diagram illustrating an exemplary row decoder 188 shown in FIG. 4. A NOR gate 202 receives the PGM signal and the INB signal, which activates the row decoder 188 when low (logic "0"). The NOR gate 202 is coupled to an inverter 204, which is coupled to the gate of a p-channel device 206. A NAND gate 208 receives the PGMB signal and the INB signal, and is coupled to an inverter 210, which is coupled to the gate of an N-channel device 212. N-channel device 212 and p-channel device 206 are each coupled to another N-channel device 214. A NAND gate 216 receives the PGM signal and the INB signal, and is coupled to an inverter 218. Inverter 218 generates the voltage source signal Vs. Vio is typically 3.3 volts.

An inverter 220 receives the INB signal and is coupled to the gate of an N-channel device 222. N-channel device 222 is coupled to another N-channel device 224, which is coupled to a pair of p-channel devices 226 and 228. P-channel device 226 is also coupled to another p-channel device 230.

Table 2 below identifies the various values and states of different signals shown in FIG. 5 in different modes of operation (e.g., read mode and program mode).

TABLE 2

| Signal | Read (Selected Line) | Read (Deselected Lines) | Program (Selected Line) | Program (Deselected Lines |
|---|---|---|---|---|
| PGM | 0 | 0 | 1 | 1 |
| PGMB | 1 | 1 | 0 | 0 |
| INB | 0 | 1 | 0 | 1 |
| Vpp | 3.3 V | 3.3 V | 8 V | 8 V |
| A | 0 | 1 | 1 | 1 |
| B | 0 | 1 | 0 | 0 |
| C | 3.3 V | 0 V | 8 V | 8 V |
| D | 3.3 V | 0 V | 3.3 V | 3.3 V |
| E | 3.3 V | 0 V | 3.3 V | 0 V |
| WL0 | 0 V | 3.3 V | Appx. 4 V | 8 V |
| current | no | no | Appx. 100 µAmps | Less than 1 µAmp |

For example, in the read mode, Vpp is 3.3 volts, which turns off p-channel device 228. In the read mode (for the selected line) INB is 0, which causes points A and B in the circuit to also be 0. When A and B are 0, point C is 3.3 volts. When INB is 0, the output of NAND gate 208 is 1, which causes point D to be 3.3 volts. Since C and D are 3.3 volts, p-channel devices 226 and 230 are off. Since INB is 0, E is also 3.3 volts.

In the program mode (for the selected line), Vpp is 8 volts, which turns on p-channel device 228. Alternatively, Vpp can be a higher voltage, such as 9 volts. Point A is 1 and point B is 0, which makes point C 8 volts and point D 3.3 volts. These values of C and D turn off p-channel devices 226 and 230. INB is 0, which causes point E to be 3.3 volts.

The circuit shown in FIG. 5 does not draw any current in the read mode. Additionally, in the program mode, the selected word line and the selected bit line draw current (approximately 100 microamps), but the deselected bit lines and the deselected word lines do not draw any current (i.e., less than 1 microamp). This characteristic is identified in Table 2 by the signal name "current."

Figure 6:
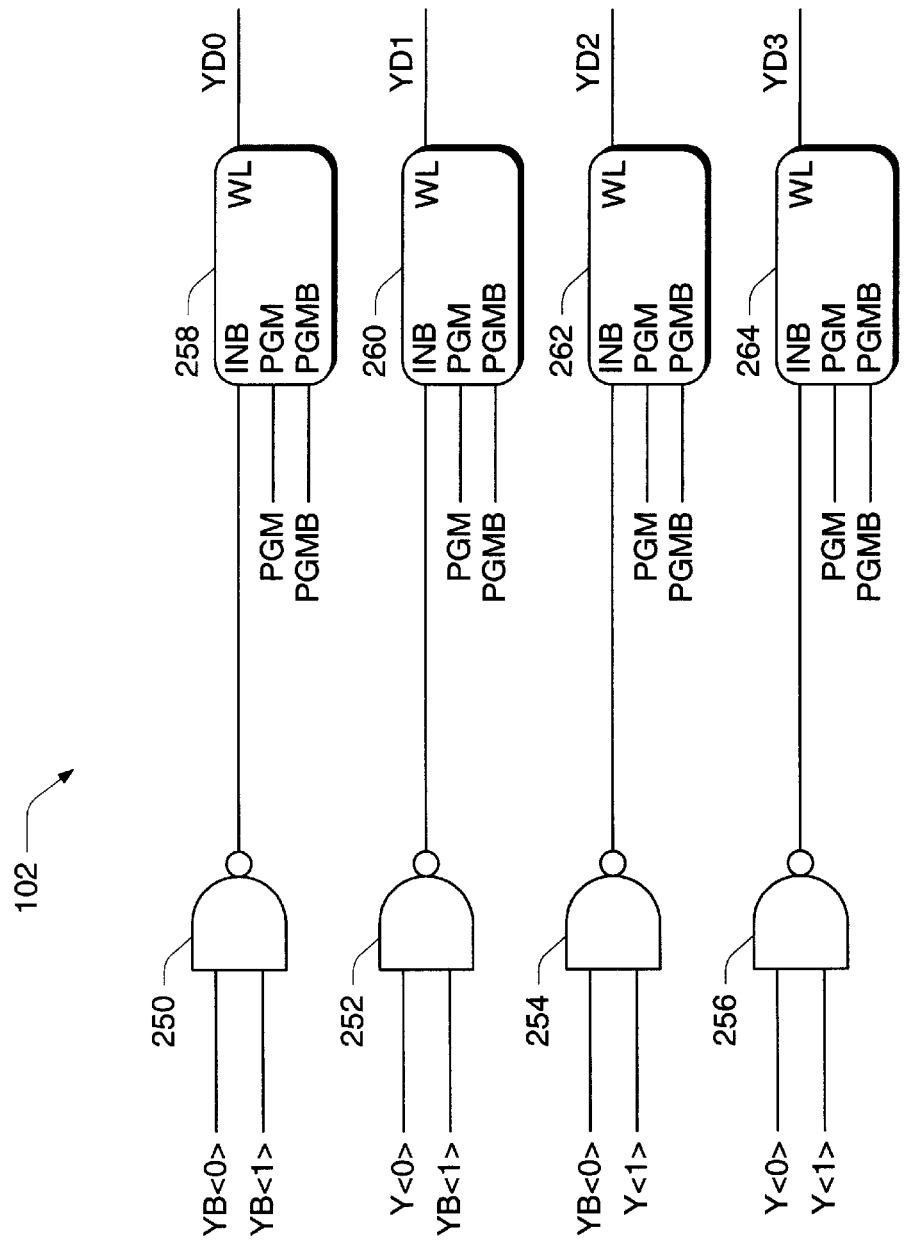
FIG. 6 is a schematic diagram illustrating an exemplary bit line control circuit.

FIG. 6 is a schematic diagram illustrating an exemplary bit line control circuit 102. Four NAND gates 250, 252, 254, and 256 receive various combinations of bits from a two-bit control signal Y. Control signal Y selects one of the four bit lines (BL0–BL3), which are activated by YD0–YD3. The output of each NAND gate 250–256 is coupled to a corresponding column decoder 258–264. Based on the value of the control signal Y, one of the four NAND gates 250–256 will generate a logic "0", which activates the corresponding column decoder 258–264. Each column decoder 258–264 receives the PGM signal, which indicates whether the memory system 100 is in read mode or program mode. Further, each row decoder is associated with a particular activation line (YD0, YD1, YD2, or YD3), which activates a corresponding bit line (BL0, BL1, BL2, or BL3). When a particular column decoder is activated by the corresponding NAND gate, the bit line associated with the column decoder is activated to select a particular column of memory cells 124.

Figure 7:
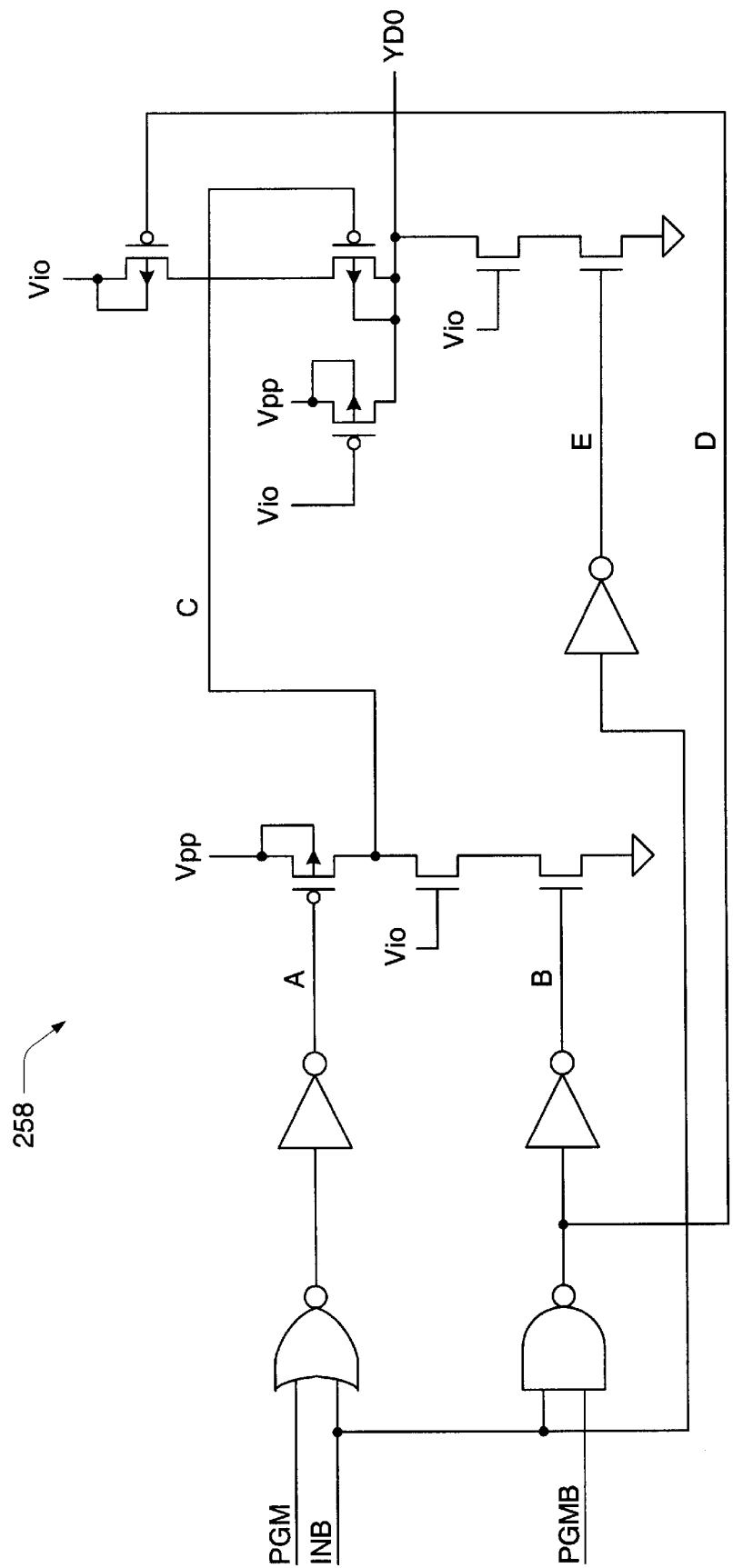
FIG. 7 is a schematic diagram illustrating an exemplary column decoder shown in FIG. 6.

FIG. 7 is a schematic diagram illustrating an exemplary column decoder 258 shown in FIG. 6. The schematic diagram shown in FIG. 7 is the same as the diagram shown in FIG. 5, with the exception of NAND gate 216 and inverter 218, which generate Vs. Thus, the operation of the circuit shown in FIG. 7 is the same as the operation of the circuit shown in FIG. 5, with the exception of the generation of the Vs signal. Further, the values and states shown in Table 2 above apply to the circuit shown in FIG. 7 in the same manner that the values and states applied to the circuit shown in FIG. 5. Thus, the circuit shown in FIG. 7 does not draw any current in the read mode, and, in the program mode, the selected word line and the selected bit line draw current, but the deselected bit lines and the deselected word lines do not draw any current.

Figure 8:
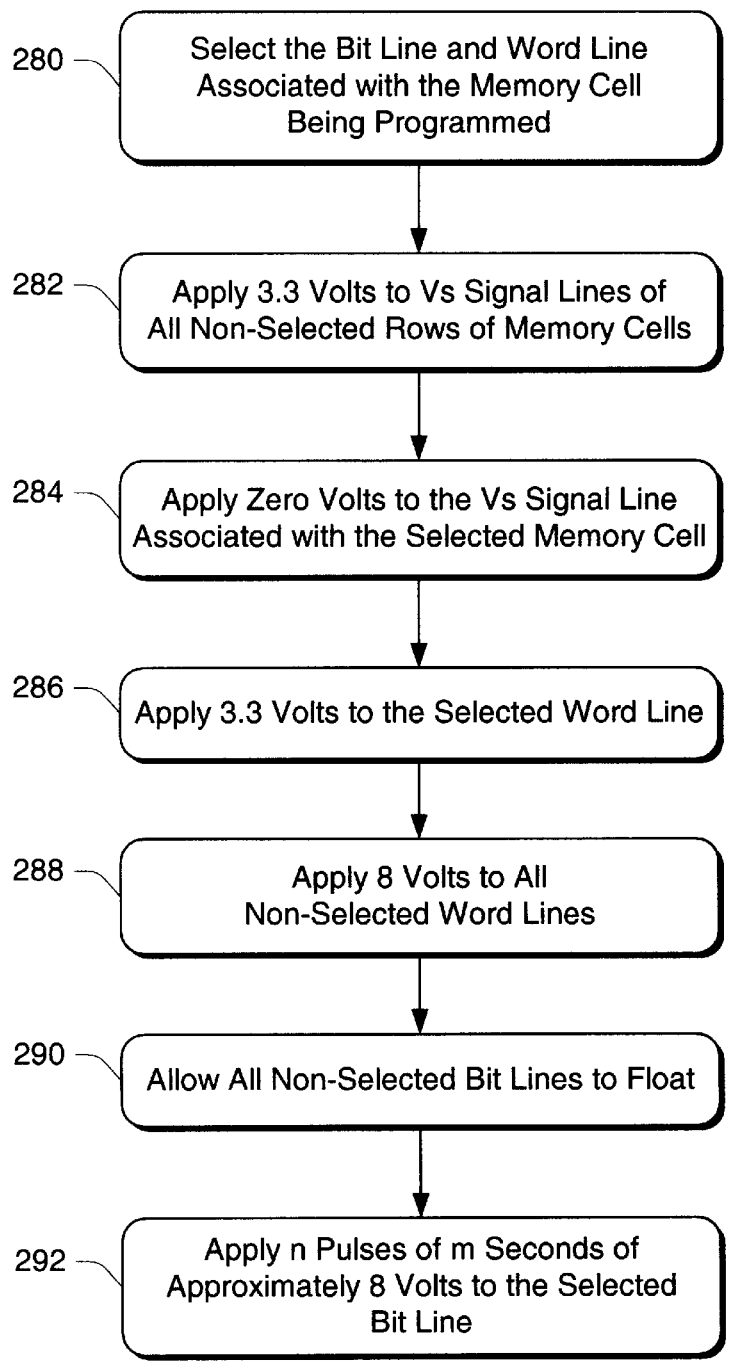
FIG. 8 is a flow diagram illustrating a procedure for programming data into a memory cell in a memory array.

FIG. 8 is a flow diagram illustrating a procedure for programming data into a memory cell in a memory array. Initially, the X and Y control signals select the bit line and word line associated with the memory cell being programmed (block 280). Next, the system applies 3.3 volts to the Vs signal lines of all non-selected rows of memory cells (block 282) to protect the access transistors in memory cells not being programmed. The Vs signal line associated with the memory cell being programmed is set to zero volts (block 284). The system applies 3.3 volts to the selected word line (block 286). Next, all non-selected word lines are applied an 8 volt signal (block 288), and all non-selected bit lines are allowed to float (block 290). Finally, the system applies n pulses of m seconds of approximately 8 volts (the programming voltage) to the selected bit line (block 292), which programs the memory cell by breaking the gate oxide of the gate breakdown transistor. The number of pulses (n) varies depending on the duration (m seconds) of each pulse.

An example of the procedure described above with respect to FIG. 8 is provided with reference to FIG. 1. In this example, the memory cell associated with bit line BL0 and word line WL0 will be programmed (i.e., the memory cell 124 in the top-left position of the array, as oriented in FIG. 1). Bit line control 102 and word line control 104 select the appropriate bit line and word line based on the X and Y control signals. A 3.3 volt signal is applied to the Vs signal lines of all non-selected memory cells—in this example, Vs1, Vs2, and Vs3. A zero volt signal is applied to the Vs signal line associated with the selected memory cell. A 3.3 volt signal is applied to the selected word line (WL0). An 8 volt signal is applied to all non-selected word lines—in this example, WL1, WL2, and WL3. All non-selected bit lines (BL1, BL2, and BL3) are allowed to float. Finally, an 8 volt signal (the programming voltage) is applied to the selected bit line (BL0), which causes the selected memory cell to be programmed by breaking the gate oxide of the gate breakdown device contained in the memory cell.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A field programmable gate array (FPGA), comprising:
   an array of memory cells;
   a word line coupled to a row of memory cells in the array; and
   a voltage signal line coupled to the row of memory cells, wherein the voltage signal line applies a zero voltage to the memory cells when programming a memory cell in the row of memory cells, and applies a positive voltage to the memory cells when programming a memory cell outside the row of memory cells.

2. The field programmable gate array of claim 1, wherein each memory cell is a non-volatile memory cell.

3. The field programmable gate array of claim 1, wherein each memory cell is one-time programmable.

4. The field programmable gate array of claim 1, wherein each memory cell includes a storage transistor having a source and a drain, wherein the source and drain of the storage transistor are coupled to the voltage signal line.

5. The field programmable gate array of claim 1, wherein each memory cell includes a storage transistor having a gate and a drain, wherein the gate and drain of the storage transistor are coupled to the voltage signal line.

6. The field programmable gate array of claim 4, wherein each memory cell further includes an access transistor coupled to the storage transistor and coupled to the word line.

7. The field programmable gate array of claim 1, wherein each memory cell is further coupled to a bit line that provides a programming voltage to the memory cell during a programming operation.

8. The field programmable gate array of claim 4, wherein the storage transistor has a gate oxide, and each of the memory cells is programmed by breaking the gate oxide of the storage transistor.

9. The field programmable gate array of claim 5, wherein the storage transistor has a gate oxide, and each of the memory cells is programmed by breaking the gate oxide of the storage transistor.

10. A non-volatile memory cell comprising:
   an access transistor coupled to a word line associated with the memory cell;
   a storage transistor coupled to the access transistor and coupled to a voltage signal line; and
   wherein the voltage signal line applies a positive voltage to the memory cell when programming a different memory cell.

11. The non-volatile memory cell of claim 10 wherein the voltage signal line applies a zero voltage to the memory cell when programming the memory cell.

12. The non-volatile memory cell of claim 10, wherein the non-volatile memory cell is one-time programmable.

13. The non-volatile memory cell of claim 10, wherein the storage transistor has a gate oxide and the storage transistor is programmed by breaking the gate oxide of the storage transistor.

14. The non-volatile memory cell of claim 10, wherein the storage transistor is further coupled to a bit line that provides a programming voltage to the memory cell during a programming operation.

15. The non-volatile memory cell of claim 10, wherein the non-volatile memory cell is located within a field programmable gate array (FPGA).

16. The non-volatile memory cell of claim 10, wherein the storage transistor has a source and a drain coupled to the voltage signal line.

17. The non-volatile memory cell of claim 10, wherein the storage transistor has a gate and a drain coupled to the voltage signal line.

18. A method of programming a memory cell in an array of memory cells, the method comprising:
   selecting a word line and a bit line associated with a memory cell being programmed;
   applying a zero voltage to a voltage signal line coupled to the memory cell, wherein the voltage signal line extends parallel to the word line; and
   applying a programming voltage on the selected bit line to program the memory cell.

19. The method of claim 18, wherein the memory cell is a non-volatile memory cell.

20. The method of claim 18, further including applying a positive voltage to the selected word line.

21. The method of claim 18, wherein the array includes a plurality of bit lines, and further including allowing all non-selected bit lines to float.

22. The method of claim 18, wherein the programming voltage is approximately 8 volts.

23. The method of claim 18, further including applying a positive voltage to a second voltage signal line coupled to a row of non-selected memory cells, wherein the second voltage signal line extends parallel to the word line associated with the row of non-selected memory cells.

* * * * *